United States Patent

Patel

[19]

[11] Patent Number: 5,875,111
[45] Date of Patent: Feb. 23, 1999

[54] METHOD FOR PROVIDING A VITAL MODEL OF A PULLUP/PULLDOWN DEVICE WITH DELAY BACK ANNOTATION

[75] Inventor: Dhimant Patel, San Jose, Calif.

[73] Assignee: Xilinx, Inc., San Jose, Calif.

[21] Appl. No.: 832,318

[22] Filed: Mar. 25, 1997

[51] Int. Cl.[6] ........................................ G06F 17/50
[52] U.S. Cl. .............................. 364/488; 364/578
[58] Field of Search .................... 364/488, 489, 364/490, 491, 578

[56] References Cited

U.S. PATENT DOCUMENTS 5,581,738  12/1996  Dombrowski ........................ 395/500

OTHER PUBLICATIONS

IEEE Vital Standard ASIC Modeling Specification 1076.4, 1995.
Krolikoski, "Standardizing ASIC Libraries in VHDL Using VITAL: a Tutorial," IEEE Custom Integrated Circuits Conference, pp. 603–610, 1995.
Bakowski et al., "VHDL Sign–off Simulation : What Future?", IEEE, pp. 136–141, 1994.

Primary Examiner—Kevin J. Teska
Assistant Examiner—Leigh Marie Garbowski
Attorney, Agent, or Firm—Edel M. Young

[57] ABSTRACT

A method of modeling a pullup device and a pulldown device with delay back annotation in accordance with the VITAL application specific integrated circuit modeling specification. The modeling method comprises the steps of modeling an entity and creating an identity primitive procedure which delays an input signal by a value specified in a timing generic and also preserves the signal shape. The procedure is then used to perform state pre-mapping of the incoming signal to preserve the identity of selected states (including all states). The delayed and pre-mapped signal forms the input to a VITAL state table to model the behavior of the device. The identity primitive procedure is then used to post-map the resulting signal in order to recover the selected states of the input signal. By altering the state pre- and post-mapping tables, either pullup or pulldown, both with delay back annotation may be modeled using the functions and procedures of the VITAL specification.

5 Claims, 10 Drawing Sheets

VDD

O

FIG. 1
PRIOR ART library IEEE;
use IEEE.STD_LOGIC_1164.all;
use IEEE.VITAL_Timing.all;

entity PULLUP is
   generic (InstancePath: STRING :="*");
   port( O :out STD_LOGIC :='H');
   attribute VITAL_LEVEL0 of PULLUP : entity is TRUE;
end PULLUP;
architecture PULLUP_V of PULLUP is
attribute VITAL_LEVEL0 of PULLUP_V : architecture is TRUE;
begin
   O <= 'H';
end PULLUP_V;

configuration CFG_PULLUP_V of PULLUP is
   for PULLUP_V
end for;
end CFG_PULLUP_V;

```
entity PULLUP is
   generic (
      InstancePath: STRING : ="*";
      tipd_O : VitalDelayType01Z : =(0 ns,0 ns,0 ns,0 ns,0 ns,0 ns)
   );
   port( O : inout STD_LOGIC :='H');
   attribute VITAL_LEVEL0 of PULLUP : entity is TRUE;
end PULLUP;
```

```
PROCEDURE VitalIDENT (
   SIGNAL     q : OUT std_ulogic;
   SIGNAL     a : IN std_ulogic;
   CONSTANT tpd_a_q : IN VitalDelayType01Z :=VitalDefDelay01Z;
   CONSTANT ResultMap : INVitalResultZMapType :=VitalDefaultResultZMap
) IS
   SUBTYPE v2 IS std_logic_vector(0 TO 1);
   VARIABLE NewValue        : UX01Z;
   VARIABLE Glitch_Data     : GlitchDataType;
   VARIABLE Dly, Glch       : TIME;
BEGIN
   == ================================
   == For ALL zero delay paths, use simple model
   == (No delay selection, glitch detection required)
   == ================================
   IF (tpd_a_q = VitalZeroDelay01Z) THEN
      LOOP
         q <= ResultMap(To_UX01Z(a));
         WAIT ON a;
      END LOOP;
   ELSE
      LOOP
         == ================================
         == Compute function and propation delay
         == ================================
         CASE v2'(To_X01Z(NewValue) & To_X01Z(a)) IS
            WHEN "00" => Dly := tpd_a_q(tr10);
            WHEN "01" => Dly := tpd_a_q(tr01);
            WHEN "0Z" => Dly := tpd_a_q(tr0z);
            WHEN "0X" => Dly := tpd_a_q(tr01);
            WHEN "10" => Dly := tpd_a_q(tr10);
            WHEN "11" => Dly := tpd_a_q(tr01);
            WHEN "1Z" => Dly := tpd_a_q(tr1z);
            WHEN "1X" => Dly := tpd_a_q(tr10);
            WHEN "Z0" => Dly := tpd_a_q(trz0);
            WHEN "Z1" => Dly := tpd_a_q(trz1);
            WHEN "ZZ" => Dly := 0 ns;
            WHEN "ZX" => Dly := Minimum(tpd_a_q(trz1),tpd_a_q(trz0));
            WHEN "X0" => Dly := tpd_a_q(tr10);
            WHEN "X1" => Dly := tpd_a_q(tr01);
            WHEN "XZ" => Dly := Minimum(tpd_a_q(tr0z),tpd_a_q(tr1z));
            WHEN OTHERS => Dly := Minimum(tpd_a_q(tr01),tpd_a_q(tr10));
         END CASE;
         NewValue := To_UX01Z(a);
         VitalGlitchOnEvent (q,"q",Glitch_Data,ResultMap(NewValue), Dly,
            PrimGlitchMode );
         WAIT ON a;
      END LOOP;
   END IF;
END;
```

FIG. 8
PRIOR ART

```
PROCEDURE XilinxIDENT(
  SIGNAL    q : OUT std_ulogic;
  SIGNAL    a : IN std_ulogic;
  CONSTANT tipd_a : IN VitalDelayType01Z := VitalDefDelay01Z;
  CONSTANT ResultMap : IN VitalOutputMapType := VitalDefaultOutputMap
) IS
  SUBTYPE v2 IS std_logic_vector(0 TO 1);
  VARIABLE NewValue          : std_ulogic;
  VARIABLE Dly               : TIME;

FUNCTION Minimum ( CONSTANT t1,t2 : IN TIME) RETURN TIME IS
  BEGIN
    IF (t1 < t2) THEN RETURN (t1); ELSE RETURN (t2);  END IF;
  END Minimum;

BEGIN
== ================================
== Zero delay path
== ================================
  IF (tipd_a = VitalZeroDelay01Z) THEN
    LOOP
      q <= ResultMap(a);
      WAIT ON a;
    END LOOP;
  ELSE
    LOOP
      == ================================
      == Compute function and propagation delay
      == ================================
      CASE v2'(To_X01Z(NewValue) & To_X01Z(a)) IS
        WHEN "00" => Dly := tipd_a(tr10);
        WHEN "01" => Dly := tipd_a(tr01);
        WHEN "0Z" => Dly := tipd_a(tr0z);
        WHEN "0X" => Dly := tipd_a(tr01);
        WHEN "10" => Dly := tipd_a(tr10);
        WHEN "11" => Dly := tipd_a(tr01);
        WHEN "1Z" => Dly := tipd_a(tr1z);
        WHEN "1X" => Dly := tpid_a(tr10);
        WHEN "Z0" => Dly := tipd_a(trz0);
        WHEN "Z1" => Dly := tipd_a(trz1);
        WHEN "ZZ" => Dly := 0 ns;
        WHEN "ZX" => Dly := Minimum(tipd_a(trz1),tipd_a(trz0));
        WHEN "X0" => Dly := tipd_a(tr10);
        WHEN "X1" => Dly := tipd_a(tr01);
        WHEN "XZ" => Dly := Minimum(tipd_a(tr0z),tipd_a(tr1z));
        WHEN OTHERS => Dly := Minimum(tipd_a(tr01),tipd_a(tr10));
      END CASE;
      NewValue := a;
      q <= Transport ResultMap(NewValue) AFTER Dly;
      WAIT ON a;
    END LOOP;
  END IF;
END XilinxIDENT;
```

|  INPUT |  | | OUTPUT |
| --- | --- | --- | --- |
| 'U' | -> | 'Z' | 'H' |
| 'X' | -> | 'Z' | 'H' |
| '0' | -> | 'Z' | 'H' |
| '1' | -> | 'Z' | 'H' |
| 'W' | -> | 'Z' | 'H' |
| 'L' | -> | 'Z' | 'H' |
| '-' | -> | 'Z' | 'H' |
| 'Z' | -> | 'U' | 'Z' |
| 'Z' | -> | 'X' | 'Z' |
| 'Z' | -> | '0' | 'Z' |
| 'Z' | -> | '1' | 'Z' |
| 'Z' | -> | 'W' | 'Z' |
| 'Z' | -> | 'L' | 'Z' |
| 'Z' | -> | '-' | 'Z' |
| 'H' | -> | 'U' | 'Z' |
| 'H' | -> | 'X' | 'Z' |
| 'H' | -> | '0' | 'Z' |
| 'H' | -> | '1' | 'Z' |
| 'H' | -> | 'W' | 'Z' |
| 'H' | -> | 'L' | 'Z' |
| 'H' | -> | '-' | 'Z' |
| 'H' |  | | NO CHANGE |

FIG. 12

CONSTANT PULLUP_tab: VitalStateTableType := (
('/', '-', '1'),
('\', '-', '0'),
('v', '-', '0'),
('X', '-', 'S'));

```
library IEEE;
library xc4000e;
use IEEE.STD_LOGIC_1164.all;
use IEEE.VITAL_Primitives.all;
use IEEE.VITAL_Timing.all;
use xc4000e.VPACKAGE.all;

entity PULLUP is
   generic (
      InstancePath: STRING :="*";
      tipd_O : VitalDelayType01Z := (0 ns, 0 ns, 0 ns, 0 ns, 0 ns, 0 ns)
   );
   port( O : inout STD_LOGIC := 'H');
   attribute VITAL_LEVEL0 of PULLUP: entity is TRUE:
end PULLUP;

architecture PULLUP_V of PULLUP is
   attribute VITAL_LEVEL0 of PULLUP_V: architecture is TRUE;
   CONSTANT PULLUP_tab : VitalStateTableType:=(
      ('/',   '-',   '1'),
      ('N',   '-',   '0'),
      ('X',   '-',   'S')
   );
   signal CLK : std_logic :='0';
   signal O_INT : std_logic :='0';
   signal Data : std_logic_vector(1 to 1);
begin
   IDENT1: XilinxIDENT(q => CLK,
                       a => O,
                       tipd_a => tipd_O,
                       ResultMap => "0000100X0");
   Data(1) <= CLK;
   PULTAB1: VitalStateTable( Result => O_INT,
                             StateTable => PULLUP_tab,
                             DataIn => Data);
   IDENT2: XilinxIDENT(q => O,
                       a => O_INT,
                       ResultMap => "ZHZHZZZZZ";
end PULLUP_V;

configuration CFG_PULLUP_V of PULLUP is
   for PULLUP_V
   end for;
end CFG_PULLUP_V;
```

FIG. 14

```
library IEEE;
library xc4000e;
use IEEE.STD_LOGIC_1164.all;
use IEEE.VITAL_Primitives.all;
use IEEE.VITAL_Timing.all;
use xc4000e.VPACKAGE.all;

entity PULLDOWN is
    generic (
        InstancePath: STRING :="*";
        tipd_O : VitalDelayType01Z := (0 ns, 0 ns, 0 ns, 0 ns, 0 ns, 0 ns)
    );
    port( O : inout STD_LOGIC := 'H');
    attribute VITAL_LEVEL0 of PULLDOWN : entity is TRUE;
end PULLDOWN;

architecture PULLDOWN_V of PULLDOWN is
    attribute VITAL_LEVEL0 of PULLDOWN_V : architecture is TRUE;
    CONSTANT PULLDOWN_tab: VitalStateTableType :=(
        ('/', '-', '1'),
        ('N', '-', '0'),
        ('X', '-', 'S')
    );
    signal CLK : std_logic :='0';
    signal O_INT : std_logic :='0';
    signal Data : std_logic_vector(1 to 1);
begin
    IDENT1: XilinxIDENT(q => CLK,
                        a => O,
                        tipd_a => tipd_O,
                        ResultMap => "000010X00");
    Data(1) <= CLK;
    PULTAB1: VitalStateTable( Result => O_INT,
                              StateTable => PULLDOWN_tab,
                              DataIn => Data);
    IDENT2: XilinxIDENT(q => O,
                        a => O_INT,
                        ResultMap => "ZLZLZZZZZ");
end PULLDOWN_V;

configuration CFG_PULLDOWN_V of PULLDOWN is
    for PULLDOWN_V
    end for;
end CFG_PULLDOWN_V;
```

FIG. 17

METHOD FOR PROVIDING A VITAL MODEL OF A PULLUP/PULLDOWN DEVICE WITH DELAY BACK ANNOTATION

FIELD OF THE INVENTION

The present invention relates generally to the field of simulation modeling and more particularly to modeling pullup and pulldown devices with delay back annotation using VITAL (VHDL Initiative Towards ASIC Libraries).

BACKGROUND OF THE INVENTION

VITAL Model of a Pullup Device Without Delay Back Annotation

Figure 1:
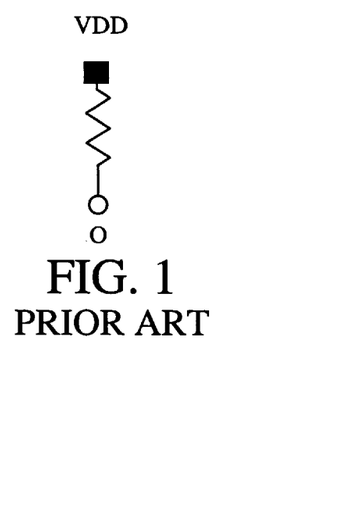
FIG. 1 is a schematic of a prior art pullup device without delay back annotation.
Figure 2:
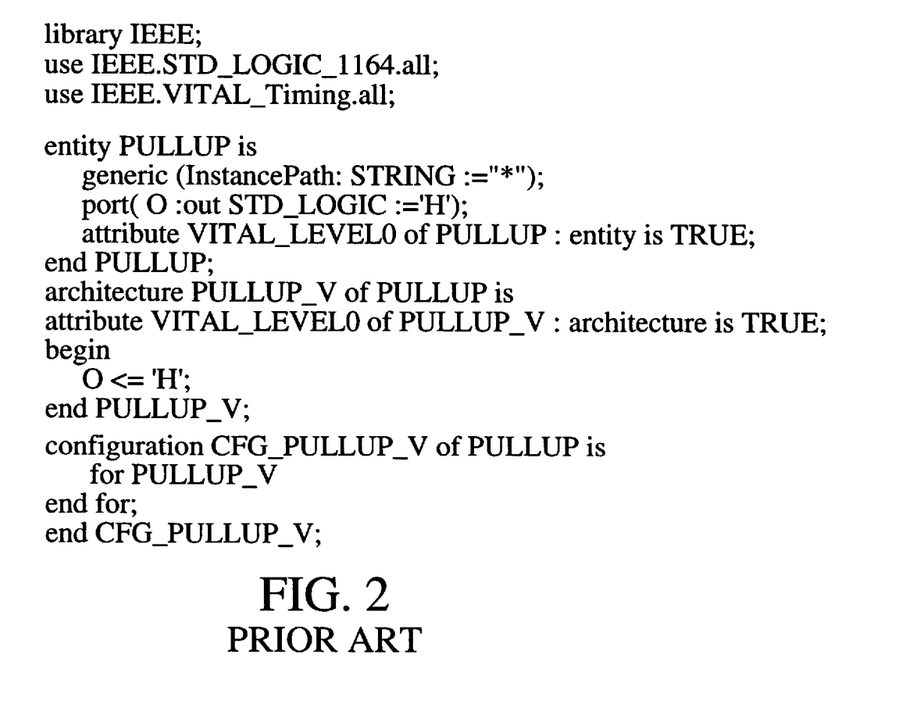
FIG. 2 is a VITAL model of a prior art pullup device without delay back annotation.

A pullup device without delay back annotation (FIG. 1) is simply a resistive connection to the bias supply VDD, and is trivially modeled as a connection to a weak '1', i.e. state 'H' in the 9-state logic system defined in the IEEE package STD_LOGIC_1164 (FIG. 2).

Conceptually, the pullup device of FIG. 1 can be thought of as supplying or outputting a weak '1' at node O. Hence, the mode of port O in FIG. 2 is 'out'.

According to the 1995 version of the IEEE VITAL standard ASIC Modeling Specification 1076.4, (which is incorporated herein by reference) a VITAL Level 1 architecture must contain at least one VITAL process statement or VITAL concurrent procedure call. Since the architecture in FIG. 2 contains neither of these two constructs, it can only be decorated with a VITAL_LEVEL0 attribute, which designates a VITAL Level 0 architecture.

Note that the reference to the VITAL_Timing package in the second library use statement is required, even though the model does not have delay back annotation. This is because the package contains definitions for the VITAL_LEVEL0 and VITAL_LEVEL1 attributes.

Rationale for Developing a Pullup Model with Delay Back Annotation

The modeling problem becomes significantly more complex if the model is required to import a delay via a timing generic and apply it to model the transition delay from the high impedance state 'Z' to the weak '1' state 'H' at port O. In practice, this modeling requirement can arise in a high speed design employing wired logic. Consider, for example, two tristate buffers TBUF1 and TBUF2 whose output ports O1 and O2 are tied together and connected to the port O of a pullup device PULLUP (FIG. 3).

Figure 3:
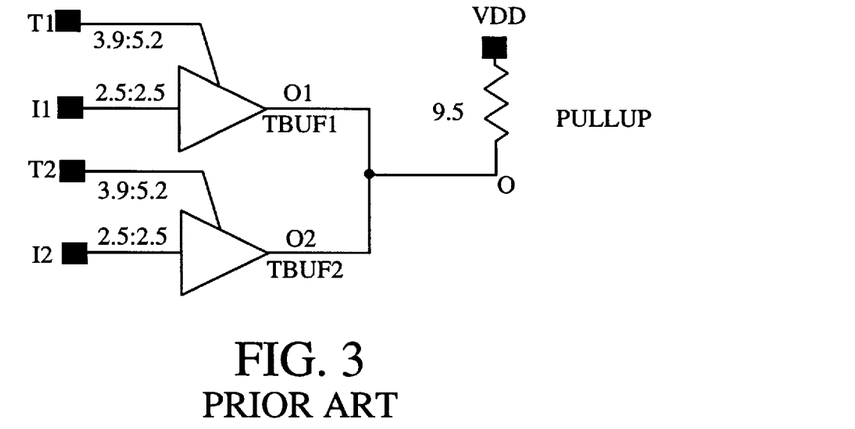
FIG. 3 is a schematic of a prior art circuit using a pullup device modeled to have delay back annotation capability.

In FIG. 3, the numbers are delay values in nanoseconds. Two numbers separated by a colon specify rise and fall delay values, respectively. For example, in TBUF1, 2.5:2.5 denotes a rise delay of 2.5 ns from port I1 to port O, and a fall delay of 2.5 ns from port I1 to port O.

In FIG. 3, tristate enable ports T1 and T2 are assumed to be active high. (Active high means that the buffer output will be high impedance when the tristate control signal is high.) Referring again to TBUF1, port O will go to the high impedance state 'Z' 3.9 ns after port T1 goes to '1'. Port O will go to '0' or '1' 5.2 ns after port T1 goes to '0'. The delay of 9.5 ns shown for PULLUP signifies that port O will go to the 'H' state 9.5 ns after it enters the 'Z' state, but only if the model for PULLUP allows back annotation of a delay for use in modeling the 'Z'-to-'H' transition. The simple model of FIG. 2 doesn't allow this back annotation. Therefore, the delay of 9.5 ns has to be accounted for by adding it to the tristate enable delay of 3.9 ns as shown in FIG. 4.

Figure 4:
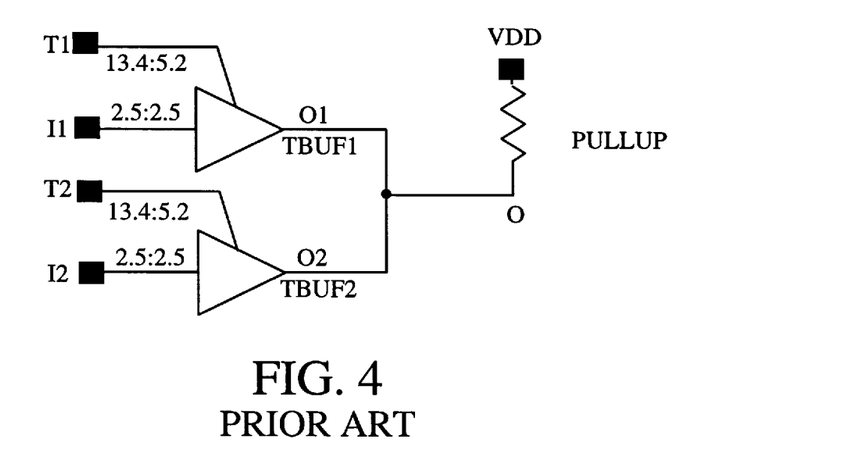
FIG. 4 is a schematic of the same prior art circuit using the pullup device modeled not to have delay back annotation capability.

In FIG. 4, assuming TBUF1 is on (i.e. port T1 is '0'), port I1 is '0', TBUF2 is off (i.e., port T2 is '1') and port I2 is '1', a '0' to '1' transition at port T1 will cause port O to go from '0' to 'H' 13.4 ns later, without first going to 'Z'. Therefore, for contention free operation, TBUF2 cannot be switched on until (13.4 ns–5.2 ns) i.e. 8.2 ns after TBUF1 has been switched off. For high speed applications, where every nanosecond counts, this long delay of 8.2 ns may not be acceptable. Hence the rationale for developing a pullup model with delay back annotation.

SUMMARY OF THE INVENTION

According to the invention, a method of modeling a device such as a pullup device or a pulldown device with delay back annotation in accordance with the VITAL application specific integrated circuit modeling specification is provided. The modeling method comprises the steps of (1) modeling an entity with a timing generic and a port, (2) creating an identity primitive procedure, which delays an input signal by a value specified in the timing generic. In the case of a pullup or pulldown device the procedure must also preserve the signal shape. (3) The procedure is then used to pre-map the incoming signal in order to preserve the identity of selected states of the incoming signal. (4) The delayed and pre-mapped signal forms the input to a VITAL state table, and the state table is used to model the behavior of the device. (5) Then the identity primitive procedure is used again, this time to post-map the resulting signal, and thus to recover the selected states of the signal. In one embodiment discussed in detail, states associated with a pullup or pulldown device are preserved. In other embodiments, other states, or all states can be preserved.

DETAILED DESCRIPTION OF PREFERRED EMBODIMENTS

Entity for VITAL Pullup Model with Delay Back Annotation

The most important feature of the model is to be able to change the state of its port O from 'Z' to 'H' after an externally supplied delay, where the 'Z' state is caused, for example, by a tristatable device whose output port is connected to O switching to its high impedance state. Thus, the model must be able to sense that the port O has attained the high impedance state, and respond by driving the state 'H' onto O after the externally supplied delay. The foregoing implies that the mode of port O must be 'inout', since the port will both be read from as well as assigned to.

In a VITAL-compliant model, the externally supplied delay must be specified via a timing generic whose name adheres to the VITAL naming conventions for timing generics. One of three possible timing generic names could be used:

1. tipd_<InputPort>
2. tpd_<InputPort>_<OutputPort>
3. Tdevice_<InstanceName>[<OutputPort>]

where an item enclosed in angle brackets denotes the name of the item, and an item enclosed in square brackets denotes that the item is optional.

Choice 3 would require referring to a component instance within the model, violating the desirability of having the model as the lowest-level component in the design hierarchy.

Choice 2 looks unnatural if port O is used for both input and output (i.e. tpd_O_O), since propagation delays are typically specified from an input port to a different port (which is an output port). The second O in tpd_O_O could be replaced by say, OINT, where OINT is an internal signal. However, this would make it like Choice 3.

Choice 1, which specifies an interconnect delay associated with the single port O of mode 'inout' (i.e. tipd_O) is the most natural way of specifying the delay. Since transitions to and from 'Z' need to be modeled, the type of this timing generic has to be VitalDelayType01Z.

XilinxIDENT: a True Identity Primitive with Optional State Mapping

Figure 5:
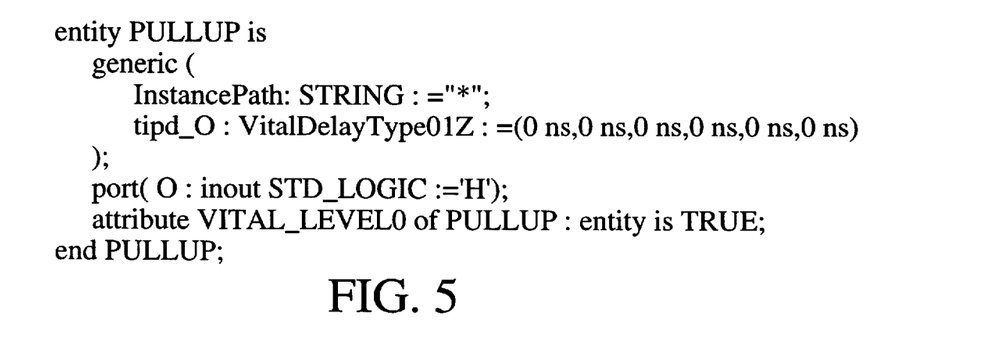
FIG. 5 is an entity definition for a VITAL pullup model with delay back annotation according to the invention.

The VITAL procedure VitalWireDelay could be used to model the delay imported via the generic tipd_O in FIG. 5. This procedure would pass the state of the input signal to the output without altering it.

An edge-triggered storage element implemented using the overloaded VITAL procedure VitalStateTable is necessary to model the 'to Z' and 'from Z or H' transitions. This procedure performs a state mapping of its input and state vectors as shown in FIG. 6.

The above state mapping maps 'U', 'X', 'Z', 'W', and '-' all to 'X', causing an incoming 'Z' to lose its identity. Moreover, the mapping maps 'H' and '1' to the same state '1', causing the 'H' also to lose its identity. The only way to preserve the identity of the incoming 'Z' and 'H' is to perform a state pre-mapping so that the incoming 'Z' and 'H' are mapped to states that are distinct both from each other and from the remaining seven states. Such a state pre-mapping is shown in FIG. 7.

Figure 6:
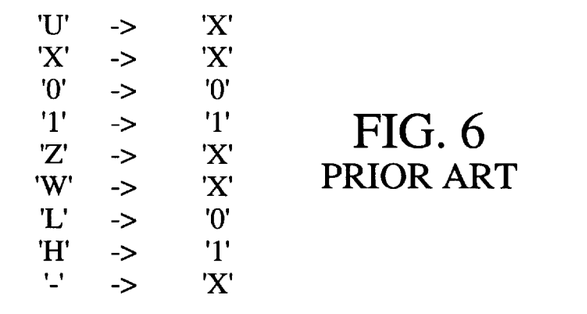
FIG. 6 shows the prior art input and state vector mapping done by VitalStateTable.
Figure 7:
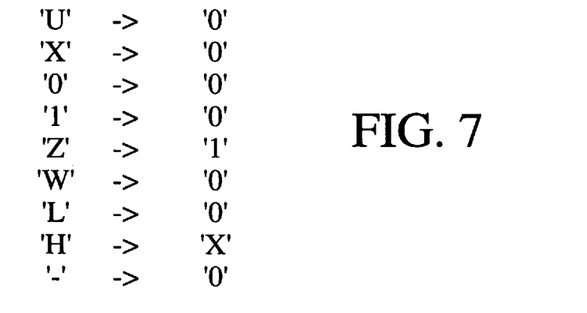
FIG. 7 shows a state pre-mapping required to preserve incoming "Z" and "H" states.

With the state pre-mapping of FIG. 7, the identity of 'Z' and 'H' are preserved after the VitalStateTable state mapping of FIG. 6. Note that the mapping of FIG. 7 is not unique and that other combinations are possible, e.g. 'Z'→'0', 'H'→'1', the rest →'X'.

The VITAL procedure VitalWireDelay implements delay modeling for wire delays but does not provide state mapping. A procedure that provides both delay modeling and state mapping is the VITAL identity primitive VitalIdent reproduced in FIG. 8.

A true identity primitive should preserve the state and also the shape of its input signal. The VITAL identity primitive VitalIDENT shown in FIG. 8 performs the state mapping shown in FIG. 9. With this mapping, the state of the input is not preserved. Specifically, since both '1' and 'H' are mapped to '1', the identity of an incoming 'H ' is lost.

Figure 8:
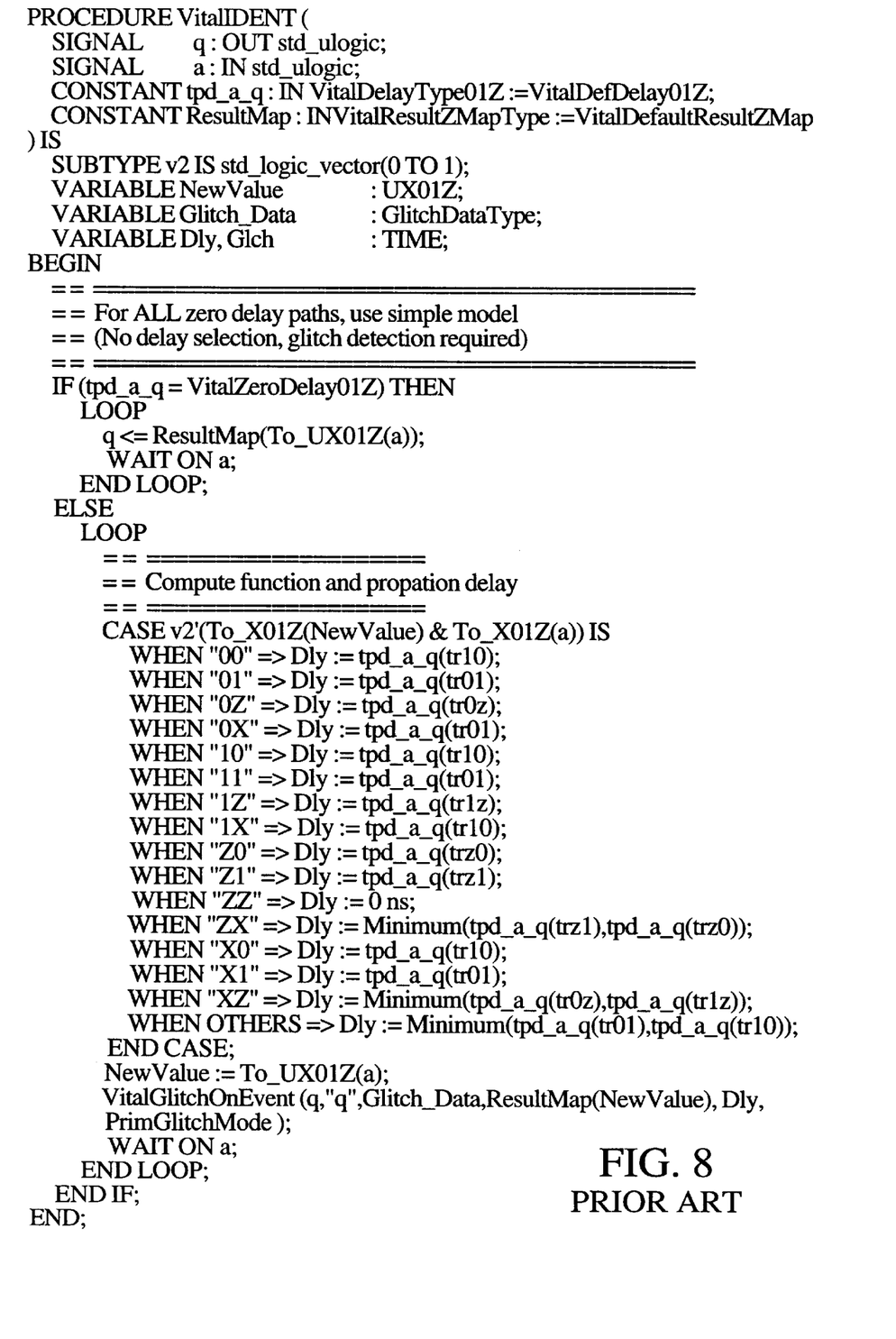
FIG. 8 shows the prior art VITAL identity primitive procedure "VITALIDENT"
Figure 9:
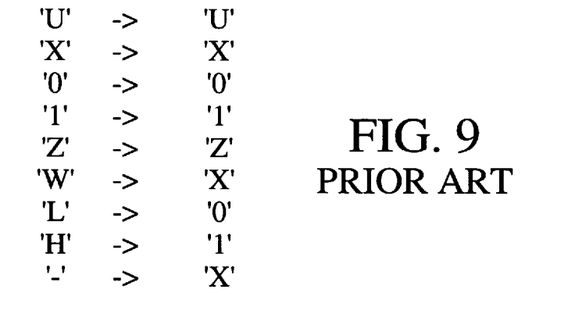
FIG. 9 shows the prior art state mapping done by VITALIDENT.

Further, glitch detection and handling are performed in VitalIDENT by a call to the procedure VitalGlitchOnEvent. This procedure (not shown here) implements one of the following options upon detection of a glitch, depending on the value specified for its argument GlitchMode:

1. Issues a message, generates an 'X ' at the output, and transmits the glitch from input to output after a delay equal to the value specified for the VitalIDENT argument tpd_a_q.

2. Issues a message. Depending on whether or not the glitch is narrower than the value specified for the VitalIDENT argument tpd_a_q, absorbs (and thus loses) the glitch, or transmits the glitch from input to output after a delay equal to the value specified for tpd_a_q.

3. Generates an 'X ' at the output, and transmits the glitch from input to output after a delay equal to the value specified for the VitalIDENT argument tpd_a_q.

4. Depending on whether or not the glitch is narrower than the value specified for VitalIDENT argument tpd_a_q, absorbs the glitch, or transmits it from input to output after a delay equal to the value specified for tpd_a_q.

None of the above four options provides the desired behavior. Either the input signal shape is not preserved (the glitch is absorbed), or the glitch is unconditionally transmitted but is always accompanied by an 'X ', and optionally a message. The desired behavior is to have the glitch unconditionally transmitted, but without an accompanying 'X ' or message.

Figure 10:
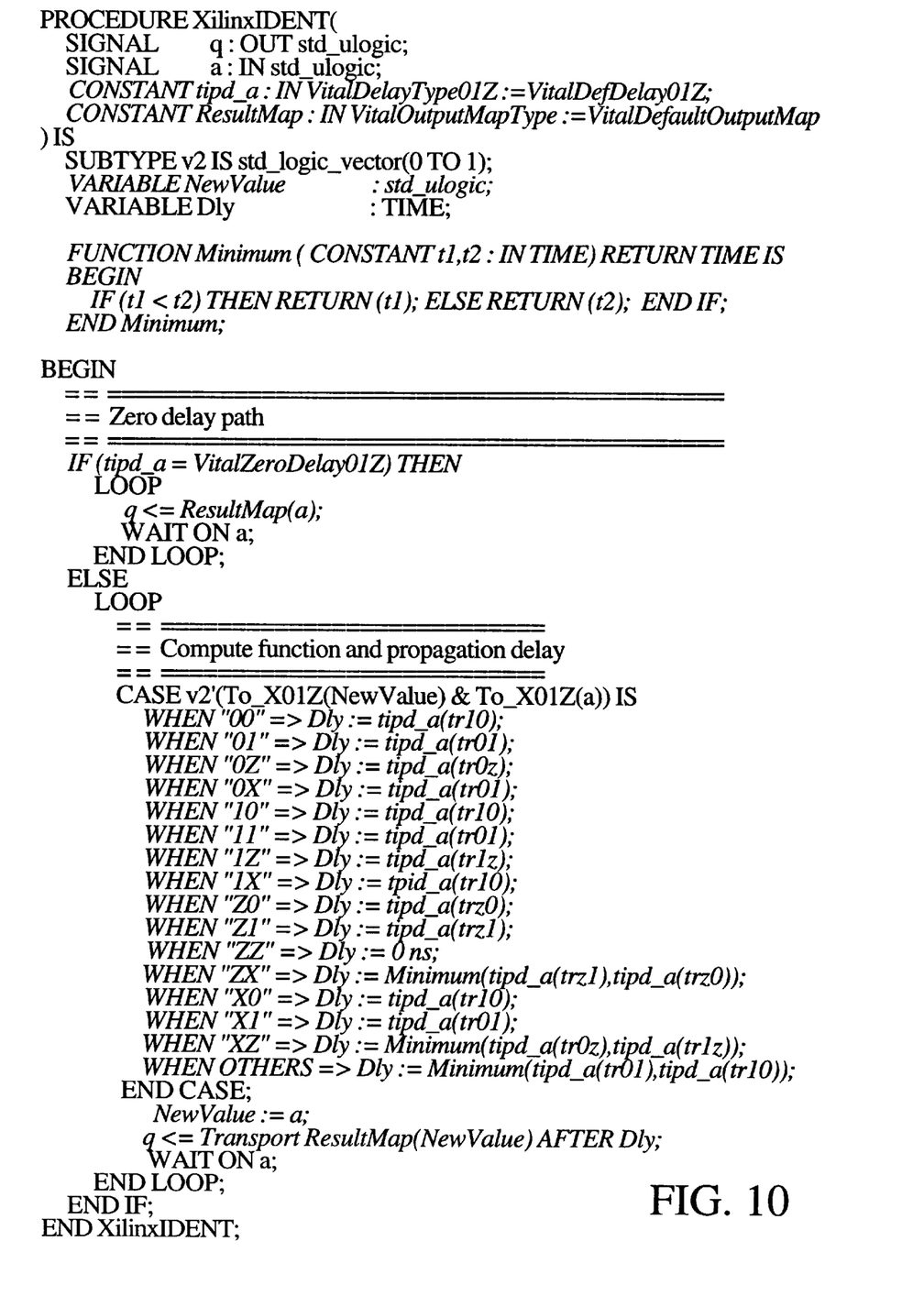
FIG. 10 is a modified form of the primitive procedure of FIG. 8 called "XilinxIDENT"

The VITAL identity primitive VitalIDENT of FIG. 8 was therefore modified to obtain the true identity primitive XilinxIDENT shown in FIG. 10.

In FIG. 10, those lines of code that are new or that differ from the corresponding lines of code in the VitalIDENT procedure of FIG. 8, are shown in italics. The new code is the function Minimum in the declaration region of the procedure, copied from the package VITAL_Timing. This was done so as to make the identity primitive procedure XilinxIDENT self contained.

Note that the propagation delay generic tpd_a_q in VitalIDENT has been replaced by the interconnect delay generic Topd_a in XilinxIDENT, in compliance with the entity definition of FIG. 5 which specifies an interconnect delay generic tipd_O.

The following changes were made in order to preserve both the state and the shape of the input signal a:

1. The type of the constant ResultMap was changed from VitalResultZMapType in VitalIDENT to VitalOutputMapType in XilinxIDENT. The former is an array of std_ulogic which can hold only 5 of the 9 states in the 9-state logic state system defined in IEEE package std_logic_1164, and is initialized to "UX01Z" (the value stored in the constant VitalDefaultResultZMap). The latter is an array of std_ulogic which can hold all 9 states, and is initialized to "UX01ZWLH-" (the value stored in the constant VitalDefaultOutputMap).

2. The type of the variable NewValue was changed from UX01Z in VitalIDENT to std_ulogic in XilinxIDENT. The former can only assume one of the five states 'U', 'X', '0', '1', or 'Z', whereas the latter can assume any one of the 9 states 'U', 'X', '0', '1', 'Z', 'W', 'L', 'H', or '-'

3. In VitalIDENT, the state of the input signal a is first converted to one of 'U', 'X', '0', '1', or 'Z' by a call to the function To_UX01Z before it is assigned to the output signal q or the variable NewValue. Additionally, the assignment to q is preceded by a mapping to one of the states in ResultMap. Thus, both q and NewValue are restricted to one of 'U', 'X', '0', '1', or 'Z'. In XilinxIDENT, the call to TO_UX01Z was removed, and with ResultMap initialized to "UX01ZWLH-" as stated in 1 above, both q and NewValue can assume any one of the 9 states in the 9-state logic state system.

4. The call to the procedure VitalGlitchOnEvent in VitalIDENT was replaced in XilinxIDENT by an assignment of the variable NewValue to the output signal q after mapping to one of the states in ResultMap and a transport delay equal to Dly, where Dly is the appropriate transition delay selected from the set of transition delays specified via the timing generic tipd_a. Thus, the shortcomings of VitalGlitchOnEvent stated previously are avoided, and with ResultMap initialized to "UX01ZWLH-" as stated in 1 above, both the state and shape of the input a are preserved.

Note that the default initialization value "UX01ZWLH-" of ResultMap, stored in the constant VitalDefaultOutputMap, can be overwritten by a different constant, allowing, for example, specification of the state pre-mapping of FIG. 7.

The development of the true identity primitive XilinxIDENT as described above, including the ability to perform state pre/post-mapping, is an important step in the realization of the VITAL model of a PULLUP with delay back annotation.

VITAL PULLUP Model with Delay Back Annotation

Figure 11:
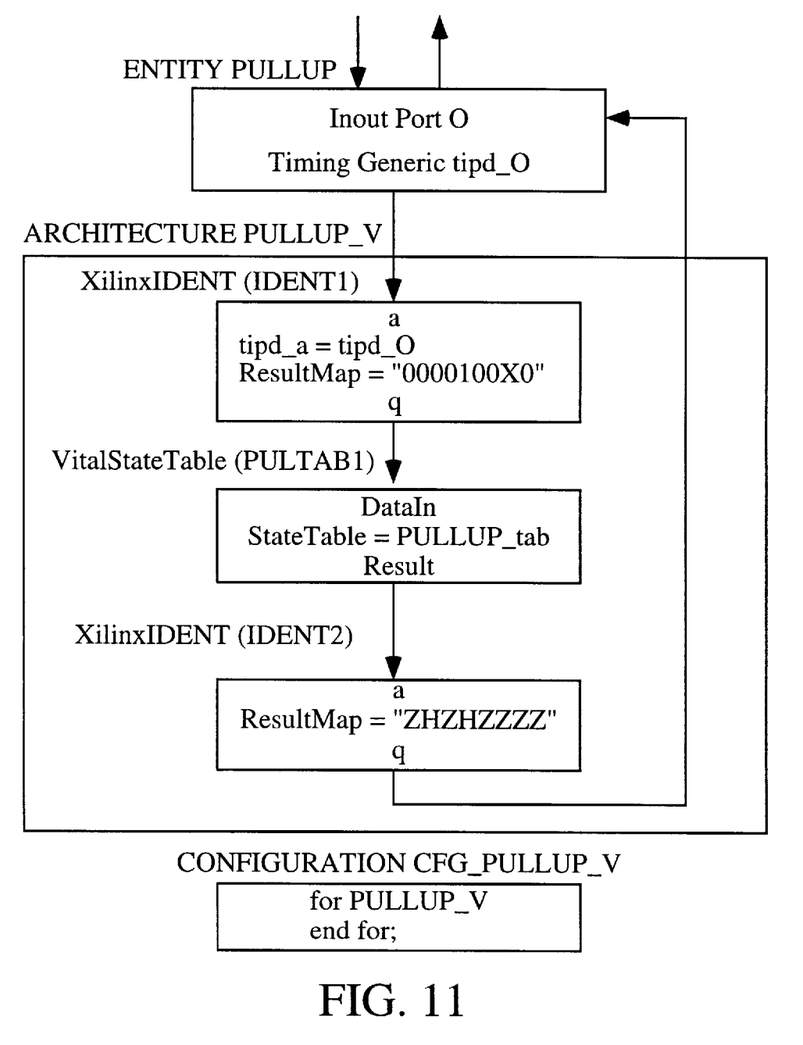
FIG. 11 is a flow diagram of a VITAL pullup model with delay back annotation according to the invention.
Figure 14:
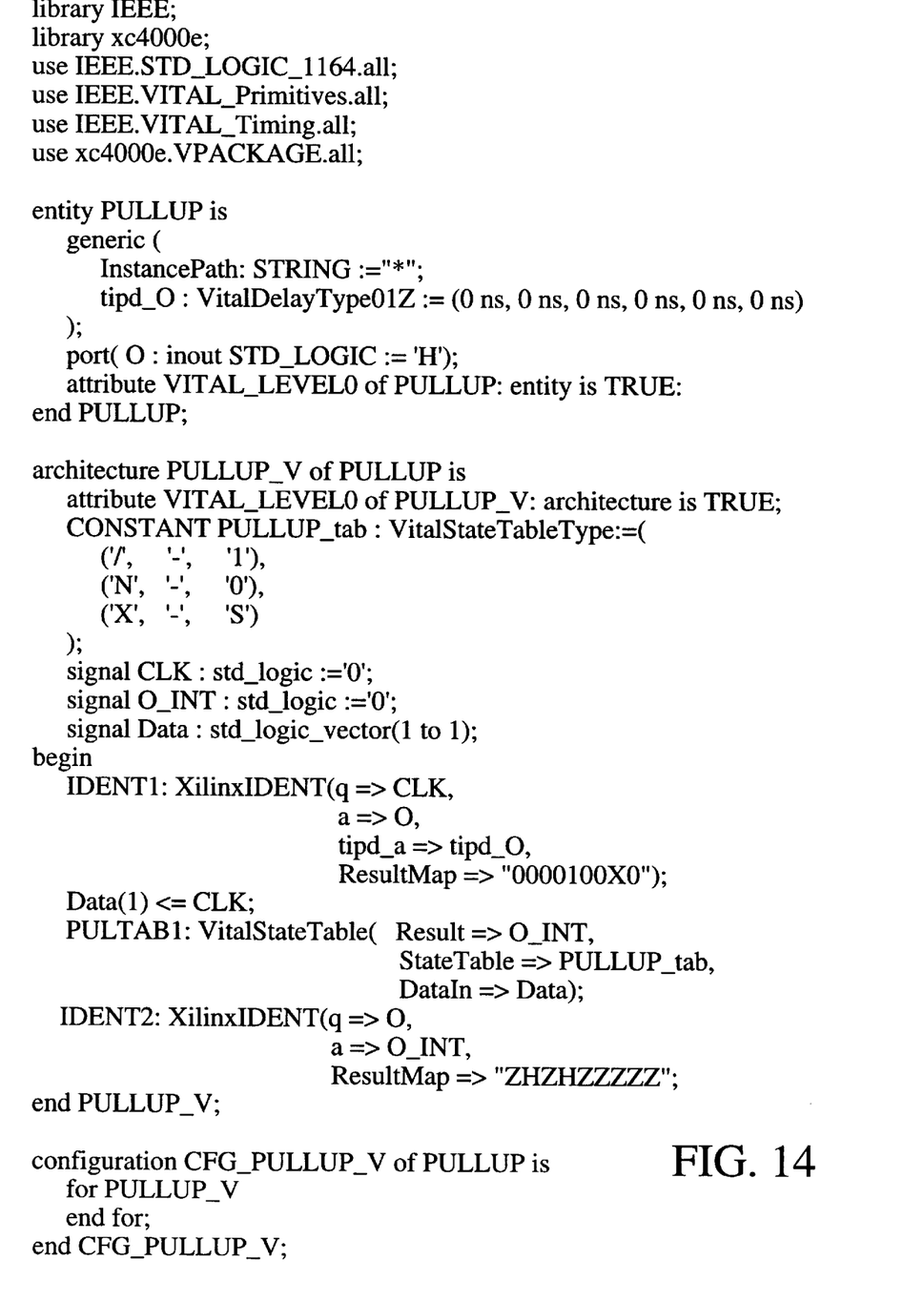
FIG. 14 is the preferred embodiment of the VITAL procedure "PULLUP" of the invention.

As a visual aid in understanding the VITAL PULLUP model with delay back annotation, reference is made to FIG. 11 which is a flow diagram of the complete (entity, architecture, and configuration) model. For clarity, library and use clauses, definitions of signals used for interconnecting primitive instances, and the definition of the state table constant PULLUP_tab assigned to argument StateTable of instance PULTAB1 of VitalStateTable, are not shown in FIG. 11. The model itself is shown in FIG. 14.

The flow diagram of FIG. 11 shows the following essential features of the model:

1. An input signal enters the model via inout (i.e. bidirectional) port O.

2. The signal is processed by instance IDENT1 of XilinxIDENT, which delays it by the value specified for the timing generic tipd_O, and performs the state pre-mapping of FIG. 7 in order to preserve the identity of an incoming 'Z' or 'H'.

3. The delayed and pre-mapped signal forms the input to instance PULTAB1 of VitalStateTable. PULTAB1 uses a VITAL state table to model the behavior of the pullup.

4. Besides the state mapping of its input and state vectors shown in FIG. 6, another limitation of the VitalStateTable procedure is that the result can only be one of the symbols '0', '1', 'X', '-', and 'Z'. A second instance IDENT2 of XilinxIDENT is therefore required to do a state post-mapping of the signal produced by PULTAB1, producing a signal in terms of 'Z' or 'H', which exits the model via port O.

The behavior of the pullup, modeled by instance PULTAB1 of procedure VitalStateTable, bears some explanation. This procedure uses the value PULLUP_tab for its argument StateTable. PULLUP_tab is a state table constant of type VitalStateTableType, defined in the declaration region of the architecture (FIG. 14). The first column of the table specifies all possible inputs that the table can encounter, where '/' denotes a '0'→'1' transition, and 'N' denotes a '1'→'0' or a 'X'→'0' transition. The third column of the table specifies the outputs resulting from the inputs in the first column, with 'S' denoting a steady value (i.e. no change). After taking into account the state pre- and post-mapping performed by IDENT1 and IDENT2 respectively, PULTAB1 models the behavior shown in FIG. 12.

Figure 12:
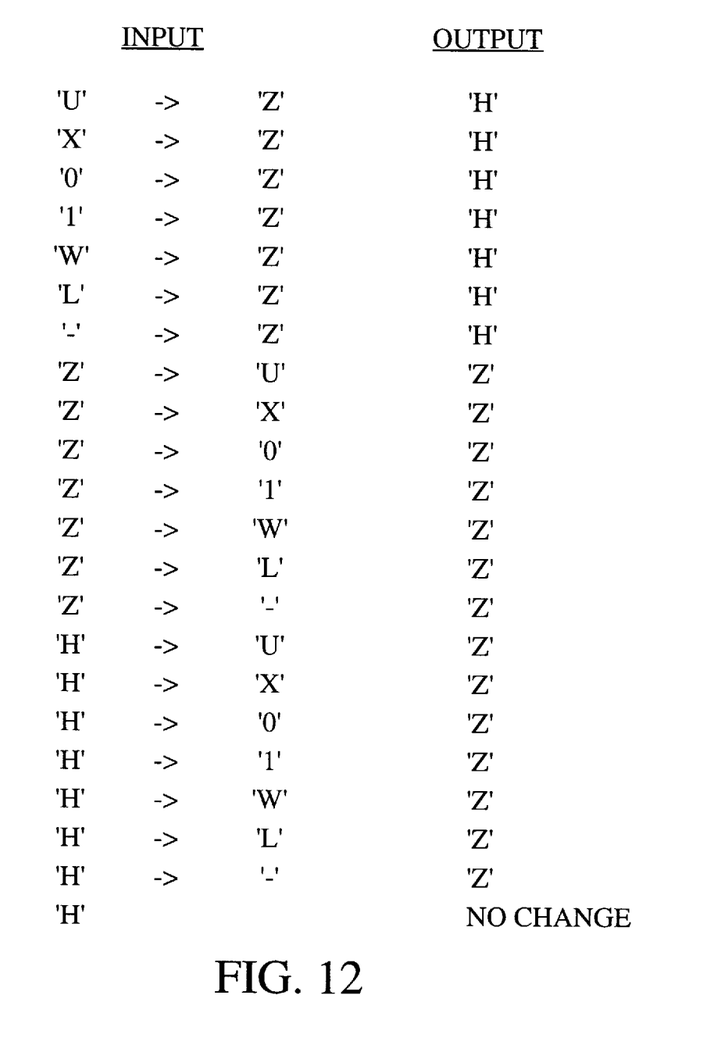
FIG. 12 is a table illustrating the behavior modeled by PULTAB1.

Referring to FIG. 12, a 'to-Z' transition at the inout port O results in a weak '1', i.e. 'H' at the port after a delay equal to the value specified for the timing generic tipd_O. Recall that the type of the timing generic tipd_O is VitalDelayType01Z. The type VitalDelayType01Z is an array of six delay values for the following state transitions in the order specified:

'0'→'1', '1'→'0', '0'→'Z', 'Z'→'1', '1'→'Z', 'Z'→'0'.

Of the above six transitions, in order to obtain the correct delay behavior, delay values should be specified for the 'to-Z' transitions three and five. Also, the remaining delay values should be set to 0. For example, using the delay value of 9.5 ns specified for PULLUP in FIG. 3, tipd_O will be assigned the following six element array:

tipd_O=(0.0 ns, 0.0 ns, 9.5 ns, 0.0 ns, 9.5 ns, 0.0 ns)

The above delay assignment is performed by the back annotation feature of the simulation software, using delay values specified in an SDF (Standard Delay Format) file.

A 'from-Z' transition at the inout port O results in the high impedance state 'Z' at the port. A 'from-H' transition at the inout port O also results in the high impedance state 'Z' at the port. A steady value of 'H' at the inout port O results in no change at the port. Since this 'H' was generated by a 'to-Z' transition at the inout port O, this value is retained until a 'from-H' transition occurs at the port, which results in a 'Z' at the port. Thus, the behavior modeled by PULTAB1 results in a 'Z' at port O, an 'H' after a delay tipd_O, or retention of a previous output 'H'.

Figure 13:
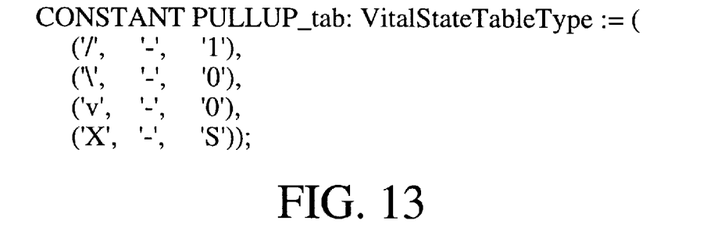
FIG. 13 is an illustration of a way to specify the constant "PULLUP_tab"

In FIG. 14, it is assumed that the identity procedure XilinxIDENT is specified in the package VPACKAGE. Note that the specification of the state table constant PULLUP_tab is not unique. For example, FIG. 13 shows a specification with the row containing 'N' replaced by two rows, one containing a '\' (denoting a '1'→'0' transition), the other containing a 'v' (denoting a 'X'→'0' transition).

Since the use of functions and procedures other than those defined in the IEEE VITAL standard packages VITAL_Primitives and VITAL_Timing, or the IEEE package std_logic1164 is not allowed inside a VITAL Level 1 architecture, the architecture in FIG. 14 can only be decorated with a VITAL_LEVEL0 attribute. Also, a concurrent modeling style has been assumed in FIG. 14. A sequential modeling style could alternatively have been used, employing non-concurrent versions of VitalStateTable and XilinxIDENT within a procedure.

Figure 15:
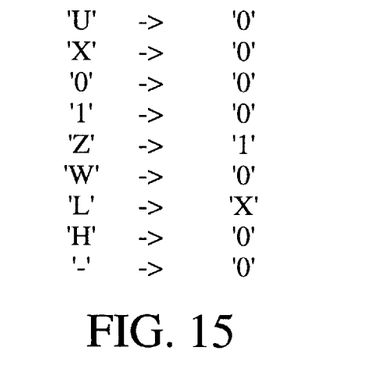
FIG. 15 is a state pre-mapping table for the VITAL model of "PULLDOWN"
Figure 16:
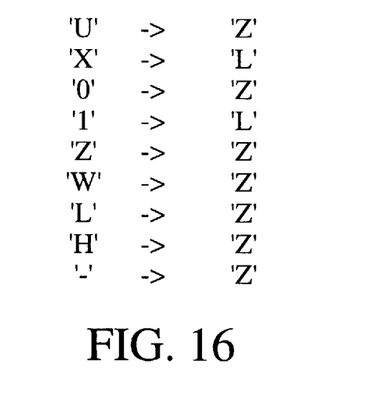
FIG. 16 is a state post-mapping table for the VITAL model of "PULLDOWN"

A pulldown device with delay back annotation is modeled by making two minor changes to the pullup model. Specifically, the values of the ResultMap argument in the instances IDENT1 and IDENT2 of the identity primitive XilinxIDENT are modified to obtain the state pre-mapping and post-mapping shown in FIGS. 15 and 16, respectively.

A 'from-Z' transition at the inout port O results in the high impedance state 'Z' at the port. A 'from-L' transition at the inout port O also results in the high impedance state 'Z' at the port. A steady value of 'L' at the inout port O results in no change at the port. Since this 'L' was generated by a 'to-Z' transition at the inout port O, this value is retained until a 'from-L' transition occurs at the port, which results in a 'Z' at the port. Thus, the behavior modeled by PULTAB1 results in a 'Z' at port O, an 'L' after a delay tipd__O, or retention of a previous output 'L'.

Figure 17:
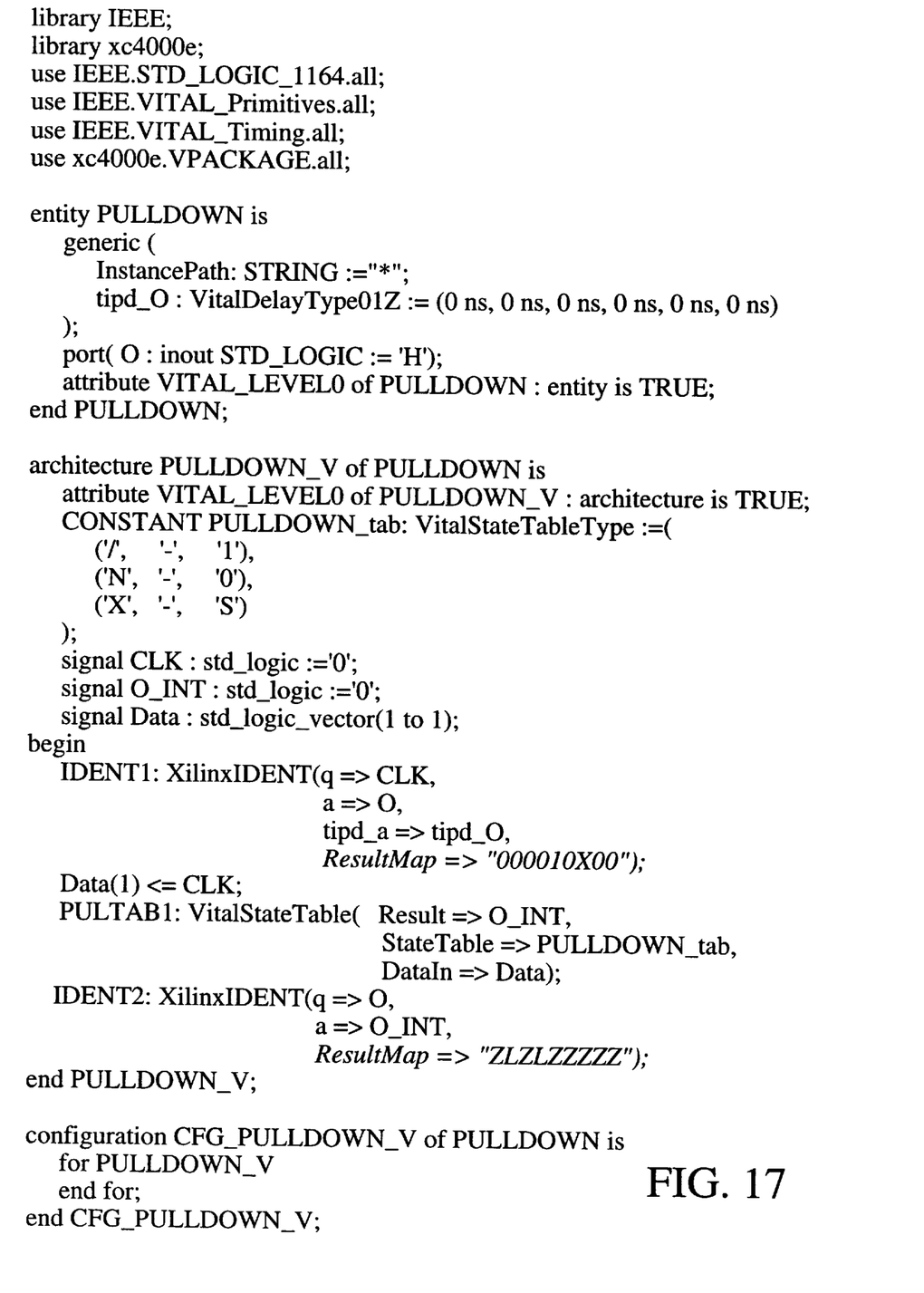
FIG. 17 is the preferred embodiment of the VITAL procedure "PULLDOWN" of the invention.

The VITAL model of the pulldown device with delay back annotation is shown in FIG. 17. The lines of code that differ from the VITAL model of the pullup in FIG. 14 are shown in italics.

It will now be apparent that the preferred embodiments of the present invention comprise a true identity primitive procedure XilinxIDENT with state mapping capability. The modeling method of the invention comprises the application of XilinxIDENT together with the VITAL state table procedure VitalStateTable in realizing the VITAL model of a pullup or pulldown device with delay back annotation.

The true identity primitive XilinxIDENT can be used in any modeling application that requires an input signal to be delayed without the state or shape of the signal being altered. Alteration of the signals's state is also possible by assigning a value to the parameter ResultMap that is different from the default value VitalDefaultOutputMap. Such alteration can be used to advantage in applications such as the VITAL model of a pullup and pulldown described here, where processing of the signal also results in alteration of its state so that two or more states become indistinguishable from each other. As shown in FIG. 11, by performing an appropriate state alteration prior to the processing (state pre-mapping) and another alteration after the processing (state post-mapping), it is possible to preserve selected states of an incoming signal which the processing by itself would have lost.

Having thus described the invention in exemplary embodiments which illustrate how to make and use the invention, what is claimed is:

What is claimed is:

1. A method of modeling a device with delay back annotation in accordance with the VITAL application specific integrated circuit modeling specification; the method comprising the following steps:

(a) modeling an entity with a timing generic and a port;

(b) creating an identity primitive procedure for preserving selected states and delaying the input signal by a value specified in the timing generic;

(c) using the identity primitive procedure, pre-mapping the input signal to preserve a set of said selected states of the input signal;

(d) modeling the desired device behavior using a VITAL state table; and (e) using the identity primitive procedure, post-mapping the signal resulting from step (d) to recover said set of selected states of the input signal.

2. A method of modeling a device as in claim 1 wherein step (b) further comprises preserving the shape of the input signal and said identity primitive is a true identity primitive.

3. A method of modeling a device as in claim 1 wherein said device is a pullup device.

4. A method of modeling a device as in claim 1 wherein said device is a pulldown device.

5. A method of modeling a device as in claim 1 wherein step (b) preserves all states of said of said input signal.

* * * * *